United States Patent
Higgins et al.

[11] Patent Number: 5,589,781
[45] Date of Patent: Dec. 31, 1996

[54] DIE CARRIER APPARATUS

[76] Inventors: H. Dan Higgins, 323 E. Redfield Rd., Chandler, Ariz. 85225; Peter Normington, 516 Country Plz. South, Gilbert, Ariz. 85234

[21] Appl. No.: 60,757

[22] Filed: May 12, 1993

Related U.S. Application Data

[63] Continuation-in-part of Ser. No. 775,914, Oct. 15, 1991, Pat. No. 5,521,518, which is a continuation-in-part of Ser. No. 585,939, Sep. 20, 1990, abandoned.

[51] Int. Cl.$^6$ .................................................. G01R 1/073
[52] U.S. Cl. ............................................ 324/755; 324/758
[58] Field of Search ....................................... 324/755, 754, 324/765, 757, 758

[56] References Cited

U.S. PATENT DOCUMENTS

| | | | |
|---|---|---|---|
| 3,826,984 | 7/1974 | Epple | 324/762 |
| 3,867,698 | 2/1975 | Beltz et al. | 324/762 |
| 4,329,642 | 5/1982 | Luthi et aql. | 324/755 |
| 4,382,228 | 5/1983 | Evans | 324/758 |
| 4,677,474 | 6/1987 | Sato et al. | 324/758 |
| 4,733,172 | 3/1988 | Smolley | 324/754 |
| 4,841,231 | 6/1989 | Angelucci | 324/757 |
| 4,899,099 | 2/1990 | Mendenhall et al. | 324/754 |
| 4,912,399 | 3/1990 | Greub et al. | 324/754 |
| 5,006,792 | 4/1991 | Mahli et al. | 324/762 |
| 5,086,269 | 2/1992 | Nobi | 324/760 |
| 5,088,190 | 2/1992 | Mahli et al. | 324/762 |
| 5,148,103 | 9/1992 | Pasiecznik, Jr. | 324/758 |
| 5,302,891 | 4/1994 | Wood et al. | 324/755 |

*Primary Examiner*—Ernest F. Karlsen
*Attorney, Agent, or Firm*—H. Gordon Shields

[57] ABSTRACT

Holder apparatus for holding an integrated circuit die for testing includes a carrier element for the die. The die is precisely located in the holder apparatus and a probe care which includes contact elements for contacting the appropriate pads on the die being tested is also secured to the holder apparatus and the card's probe needles are biased against the die. Different embodiments of the holder apparatus are disclosed, including holder apparatus with a removable alignment plate and holder apparatus with an integral alignment plate, both of which embodiments secure the die to the bottom of the holder apparatus, and holder apparatus in which the die or chip is secured to the top of the holder apparatus. Probe card apparatus usable with the various holder apparatus embodiments includes needles which comprise continuations of traces on the probe card and which include trace elements which may be connected directly to test circuitry without intermediate socket connectors.

23 Claims, 7 Drawing Sheets

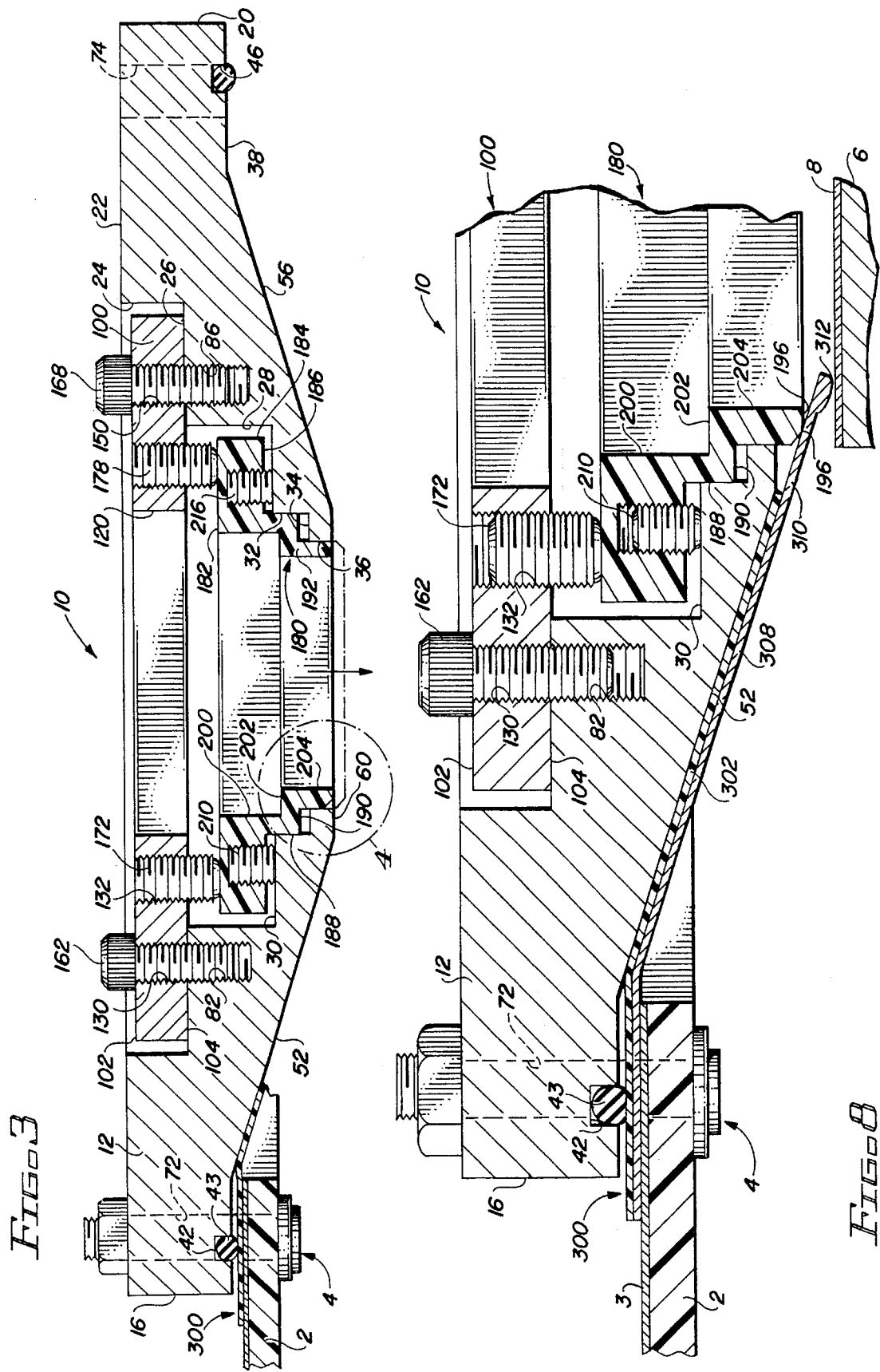

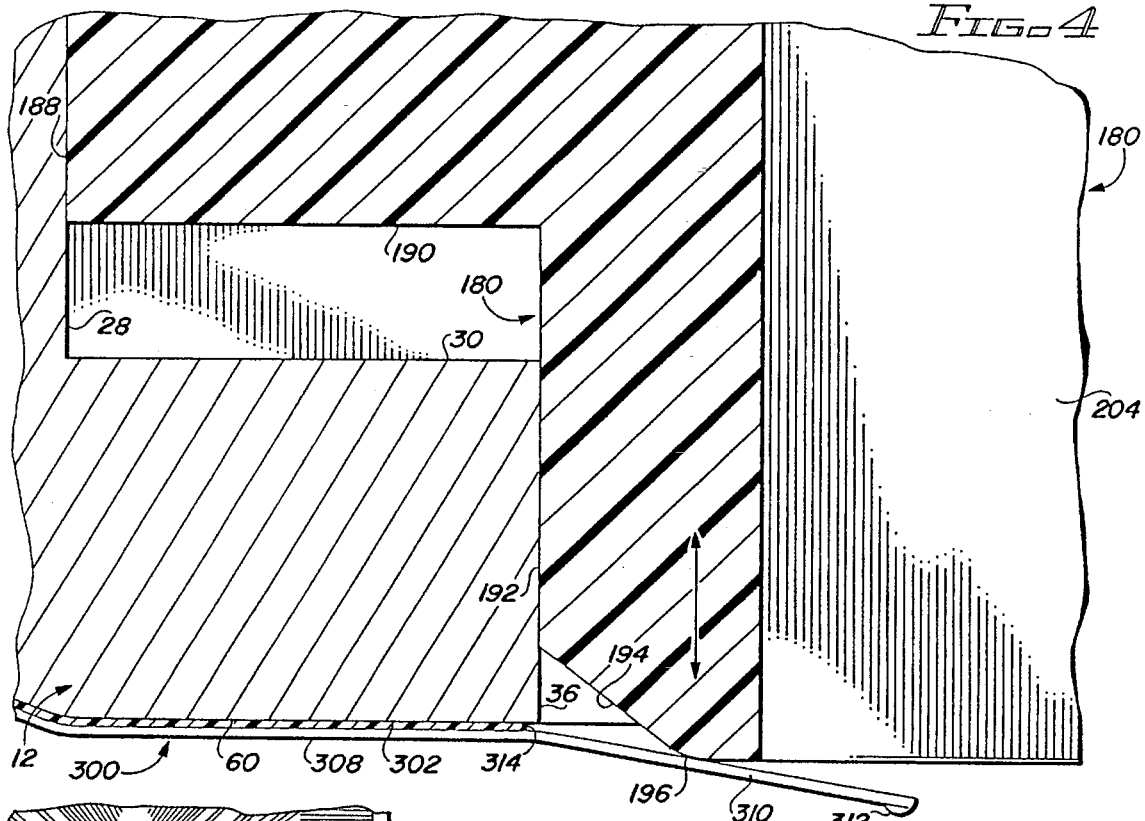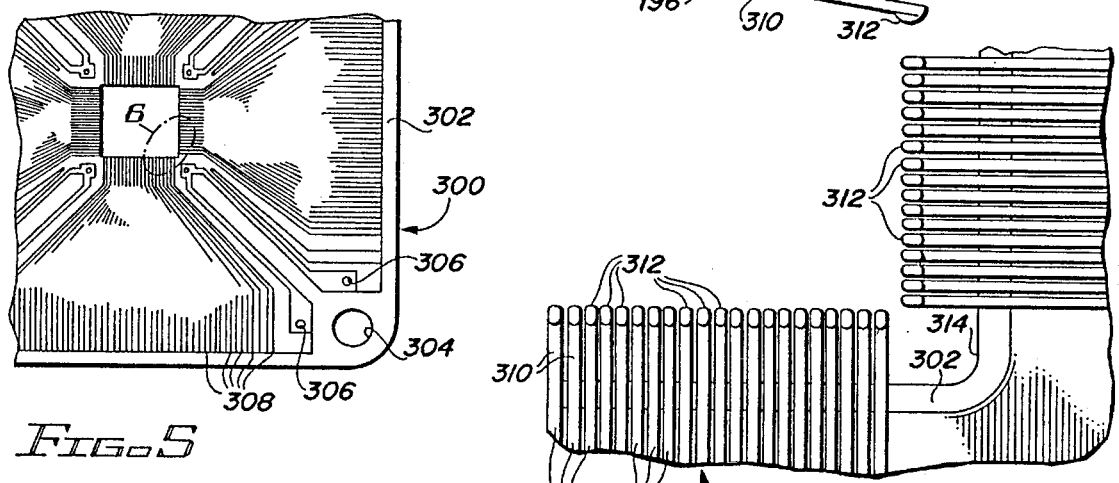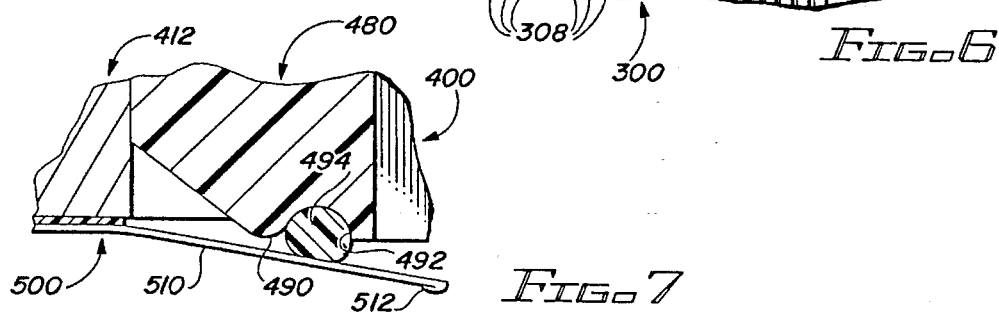

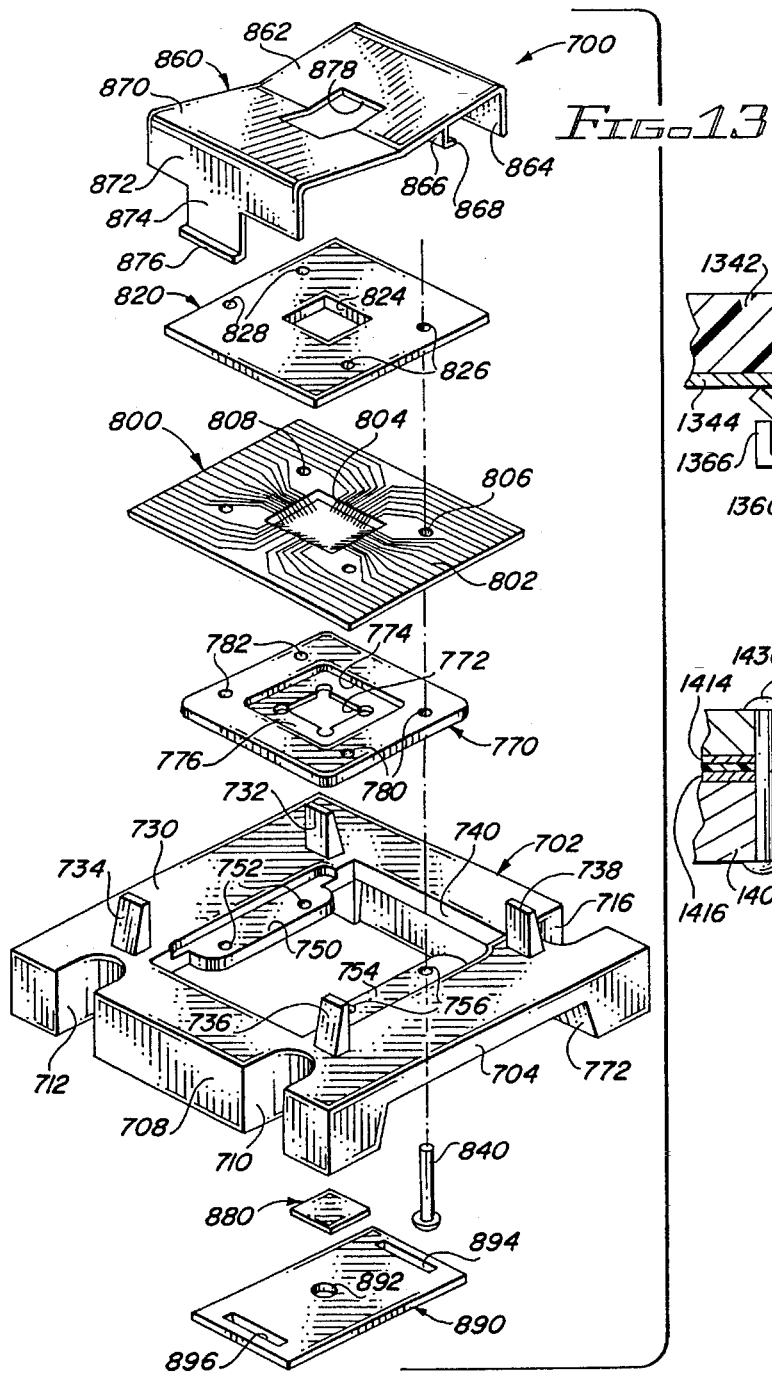
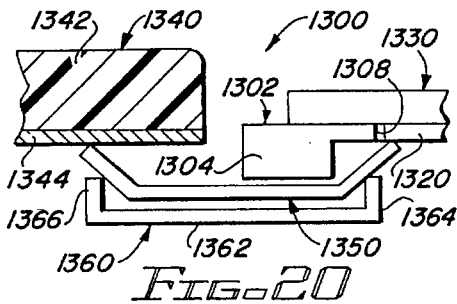
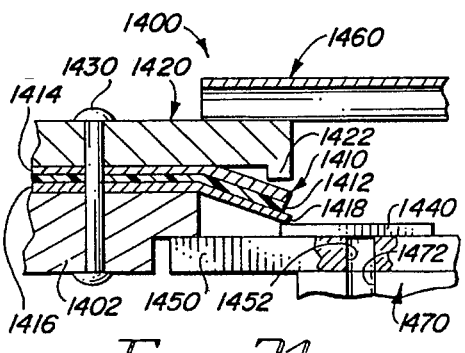
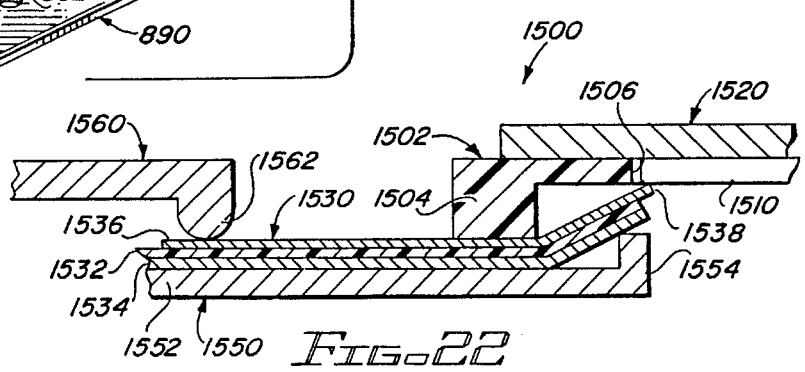

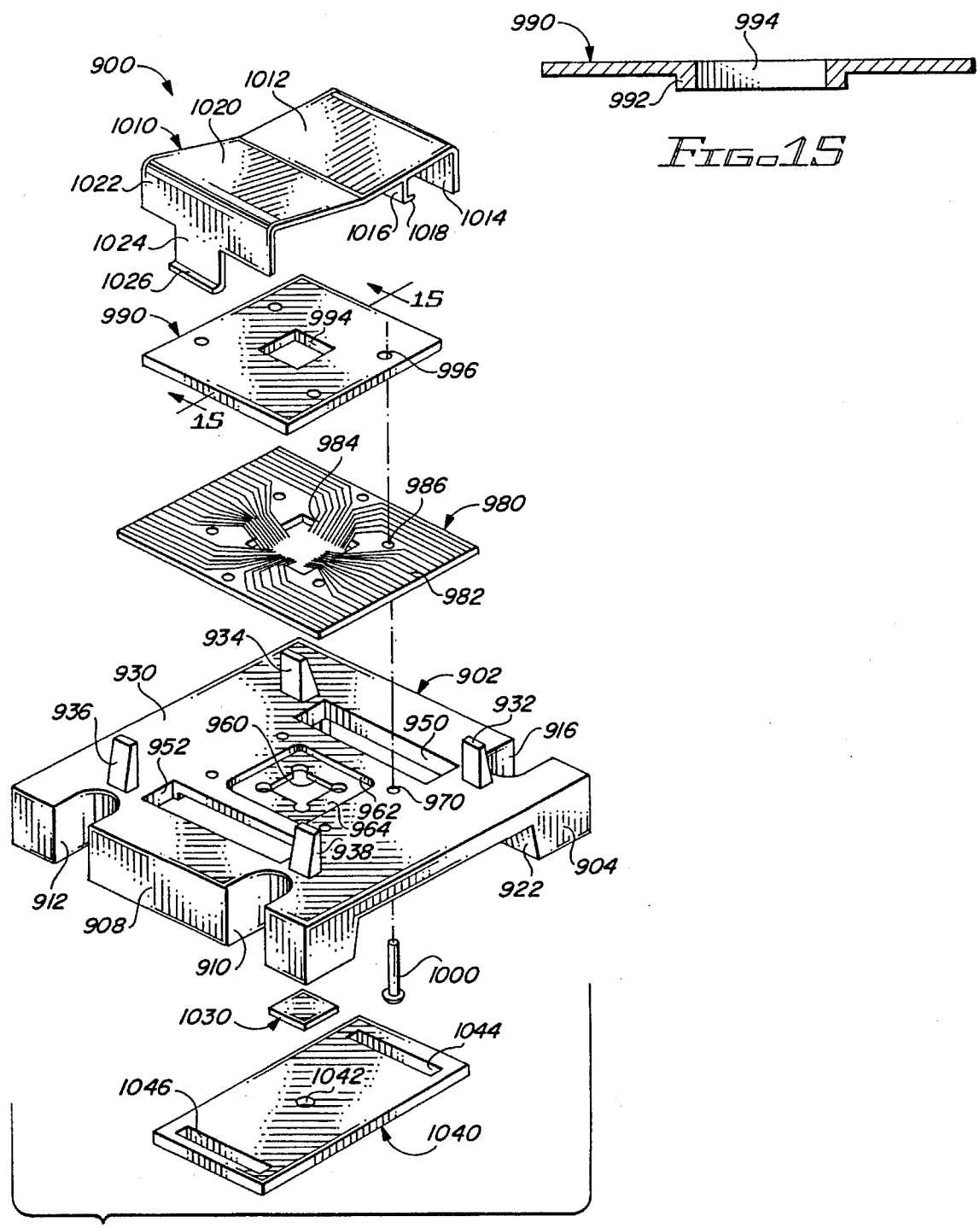

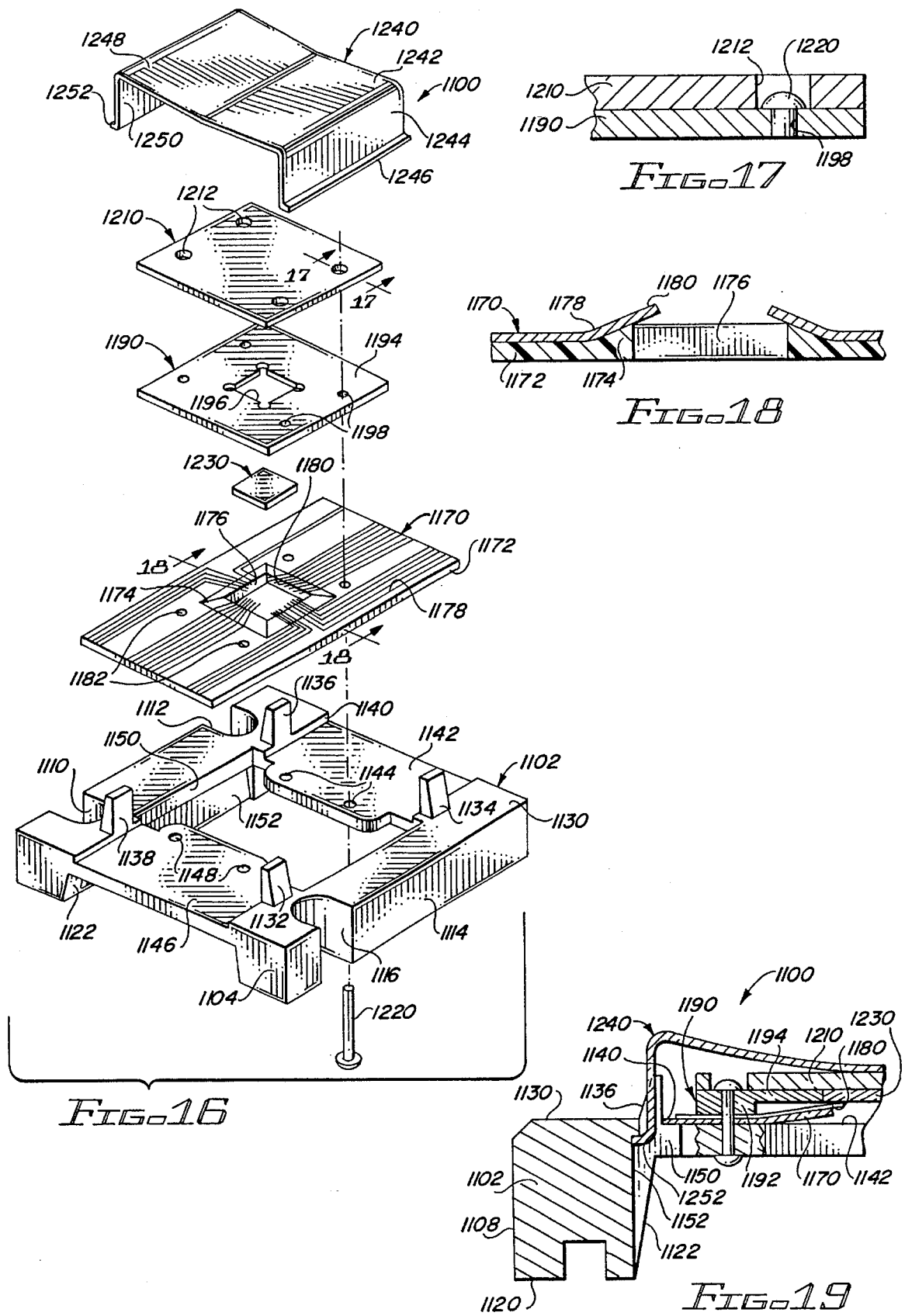

DIE CARRIER APPARATUS

CROSS REFERENCE TO RELATED APPLICATION

This application is a Continuation-In-Part application of application Ser. No. 07/775,914, filed Oct. 15, 1991, now U.S. Pat. No. 5,521,518, which was a Continuation-In-Part application of Ser. No. 07/585,939, filed Sep. 20, 1990, now abandoned.

BACKGROUND OF THE INVENTION

1. Field of the Invention

This invention relates to the testing of integrated circuit chips on semi-conductor wafers and, more particularly, to apparatus for supporting a probe card and an integrated circuit die during the testing of the integrated circuits on the die.

2. Description of the Prior Art

Integrated circuits are formed as discrete chips on round semi-conductor wafers. The integrated circuit chips are tested prior to the cutting of the wafer. Typically, chips are tested by computer operated test apparatus that exercises the circuits on the chips.

A probe card is an element which includes a plurality of electrical leads, and the leads make contact with the various circuit elements on the integrated circuit chip being tested. In the prior art, it is typical for probe cards to be built by attaching metal needles to an epoxy ring. The needles or probe elements may be secured to the ring by epoxy or they may be bonded, as by welding, to a blade. The needles are individually placed on the desired electrical elements of the chips for testing.

Integrated circuit dies are tested in a similar manner after they are fabricated or processed. The dies are placed in a die carrier and a probe card for testing the circuits on the die is placed adjacent to the die with probe card needles contacting the various pads on the die for testing.

The apparatus of the present invention uses a probe card similar to those disclosed in the parent applications identified above.

U.S. Pat. No. 3,849,728 (Evans) discloses a probe card for testing integrated circuit patterns. The apparatus includes a plurality of needles secured to needle holders, and the needle holders are in turn secured to conductive elements on a printed circuit board. The elements are all fixed relative to each other.

U.S. Pat. No. 3,939,414 (Roch) discloses an integrated circuit testing apparatus in which a test probe assembly includes elements for the precise location of a test probe both axially and vertically.

U.S. Pat. No. 4,161,692 (Tarzwell) discloses another type of probe device with probe needles secured to holder elements. The patent is primarily directed to the holder elements for the probe needles.

U.S. Pat. No. 4,518,914 (Okubo et al) discloses test probe apparatus which includes a probe card and needles extending outwardly and downwardly from the probe card. The probe card is secured to a base plate by vacuum pressure.

U.S. Pat. No. 4,636,722 (Ardezzone) discloses test probe apparatus which includes a cutout portion and an element disposed in the cutout portion adjacent to a probe assembly. The cutout portion of the Ardezzone patent actually includes two "inserts" one of which is disposed on the top of the apparatus and extends into the cutout portion, and the second is the one referred to above, that is secured to the bottom of the cutout portion and makes contact with the probe assembly.

U.S. Pat. No. 4,757,256 (Whann et al) discloses an epoxy ring probe card apparatus in which a plurality of probe elements are secured to conductive traces on the epoxy ring.

U.S. Pat. No. 4,758,785 (Rath) discloses integrated circuit testing apparatus in which a probe card includes a plurality of probe elements and a pressure pad disposed against the probe and secured to support structure by resilient attaching elements to provide vertical movement of the pressure pad relative to the probe for providing a desired pressure of the probe against an integrated circuit to be tested.

U.S. Pat. No. 4,764,723 (Strid) discloses another type of probe apparatus. The '723 apparatus is primarily directed to electrical connections involved.

U.S. Pat. No. 4,791,363 (Logan) discloses another type of probe needle apparatus. The probe needle apparatus includes a ceramic body, with a microstrip circuit element on one side of the ceramic body and a ground plane on the other side of the ceramic body. The probe apparatus of the '363 patent is designed primarily for frequencies in the Gigahertz range.

U.S. Pat. No. 4,891,585 (Janko et al) discloses another type of probe apparatus in which pressure contacts are made between the probe card apparatus and circuit elements on a wafer being tested. U.S. Pat. No. 4,899,099 (Mendenhall et al) which includes what is referred to as a flex dot wafer probe. The '099 apparatus appears to use thin film technology.

U.S. Pat. No. 4,906,920 (Huff et al) discloses a self-leveling membrane probe apparatus. The apparatus includes another carrier element and translation means disposed in a relatively movable relationship to the carrier. Spring elements secure the carrier in the translation elements together.

U.S. Pat. No. 4,912,399 (Greub et al) discloses another type of probe apparatus. The probe apparatus uses contact elements on the bottom of a support member, and the support member is used to provide a pressure contact between the contact elements and the circuit elements under test.

U.S. Pat. No. 4,918,383 (Huff et al) discloses probe card apparatus with an automatic contact scrub action. The automatic scrub action is accomplished by using fixed length and variable length flexure assemblies. The combination of fixed and variable length pivot assemblies results in a lateral or sideways movement of probe contact elements which provides an automatic scrubbing action of the contact element against the device under test.

U.S. Pat. No. 4,981,817 (Stone) discloses method and structure for testing integrated circuit chips using tape as a carrier for the integrated circuit chips.

U.S. Pat. No. 5,006,792 (Malhi et al) discloses a socket adapter for testing integrated circuit chips. A chip is inserted into the socket and the socket is in turn appropriately connected to test apparatus.

U.S. Pat. No. 5,073,117 (Mahli et al) is a division of the above referenced '792 patent and hence discloses substantially the same subject matter.

U.S. Pat. No. 5,088,190 (Mahli et al) discloses an integrated circuit test apparatus which includes holder structure for the integrated circuit die and connection elements for making electrical connection with the circuit elements on the die. The integrated circuit chip is inserted into the top of the holder apparatus and is biased downwardly to make the electrical connection with the test circuitry elements.

The apparatus of the present invention utilizes individual needles on a probe card, and the needles are bent downwardly at an angular orientation from the horizontal to provide a scrubbing action on the integrated circuit elements as the needles make contact with the integrated circuit. The scrubbing action provides a cleaning for insuring that good electrical contact is made between the needles of the probe card and the circuit elements. The needles comprise continuation of conductive traces on a probe card dielectric substrate.

The probe card of the present apparatus is secured to a probe card holder that includes a movable or adjustable element which makes contact with the probe card. A dielectric block insert in the probe card holder is adjustable to provide a desired force on the probe card needles.

SUMMARY OF THE INVENTION

Invention described and claimed herein includes a probe card and a holder for the probe card. The probe card includes a dielectric element on which a plurality of needles and needle circuit elements are etched by photolithography processes. The needles extend downwardly from the dielectric material at a typical angular orientation of between 7 and 10 degrees from the horizontal, but which may vary from zero degrees to about 45 degrees, to provide a scrubbing action on the electrical circuit elements of the integrated circuit when the probe card is moved downwardly to contact the circuit elements. The needles are integral with, and comprise continuations of, the needle circuit elements etched on the dielectric element.

The probe card is secured to a base element or holder, and the holder includes a dielectric block insert which makes contact with the needles. The dielectric block includes a tapered edge portion which acts as a fulcrum for the needles. The dielectric block insert is adjustable and is spring loaded for varying the force against the probe card and against the needles thereon.

Among the object of the present are the following:

To provide new and useful probe card apparatus;

To provide new and useful apparatus for testing integrated circuit chips;

To provide new and useful probe card apparatus having a plurality of probe needles which contact circuit elements on an integrated circuit die;

To provide new and useful probe card apparatus having a plurality of needles bent at an angle to the horizontal to provide a scrubbing action as the needles contact electrical circuit elements on an integrated circuit die;

To provide new and useful probe card apparatus in which probe needles comprise continuations of circuit elements etched on a dielectric substrate;

To provide new and useful apparatus for holding a probe card;

To provide new and useful apparatus for holding an integrated circuit die and a probe card for testing the integrated circuit die;

To provide new and useful probe card holder apparatus having a movable insert; and To provide new and useful probe card apparatus including a probe card and a holder for the probe card.

BRIEF DESCRIPTION OF THE DRAWING

FIG. 3 is a view in partial section of the apparatus taken generally along line 3—3 of FIG. 2.

FIG. 4 is an enlarged view in partial section taken generally from Circle 4 of FIG. 3.

FIG. 5 is a plan view of a portion of the apparatus of the present invention.

FIG. 6 is an enlarged view of a portion of the apparatus of FIG. 5, taken generally from Oval 6 of FIG. 5.

FIG. 7 is an enlarged view in partial section of a portion of an alternate embodiment of the apparatus of the present invention.

FIG. 8 is an enlarged view in partial section of a portion of the apparatus of the present invention in its use environment.

FIG. 13 is an exploded perspective view of the apparatus of FIGS. 10–12.

FIG. 14 is an exploded perspective view of an alternate embodiment of the apparatus of FIGS. 10–13.

FIG. 15 is an enlarged view in partial section taken generally along line 15—15 of FIG. 14.

FIG. 16 is an exploded perspective view of another alternate embodiment of the apparatus of FIGS. 10–13.

FIG. 17 is an enlarged view in partial section taken generally along line 17—17 of FIG. 16.

FIG. 18 is an enlarged view in partial section taken generally along line 18—18 of FIG. 17.

FIG. 19 is an enlarged view in partial section of a portion of the apparatus of FIG. 16 as assembled.

FIG. 20 is an enlarged view in partial section of another alternate embodiment of the apparatus of the present invention.

FIG. 21 is a side view in partial section of another alternate embodiment of the apparatus of FIGS. 10–13.

FIG. 22 is a view in partial section illustrating the operation of another alternate embodiment of the apparatus of FIGS. 10–13.

DESCRIPTION OF THE PREFERRED EMBODIMENT

Figure 1:
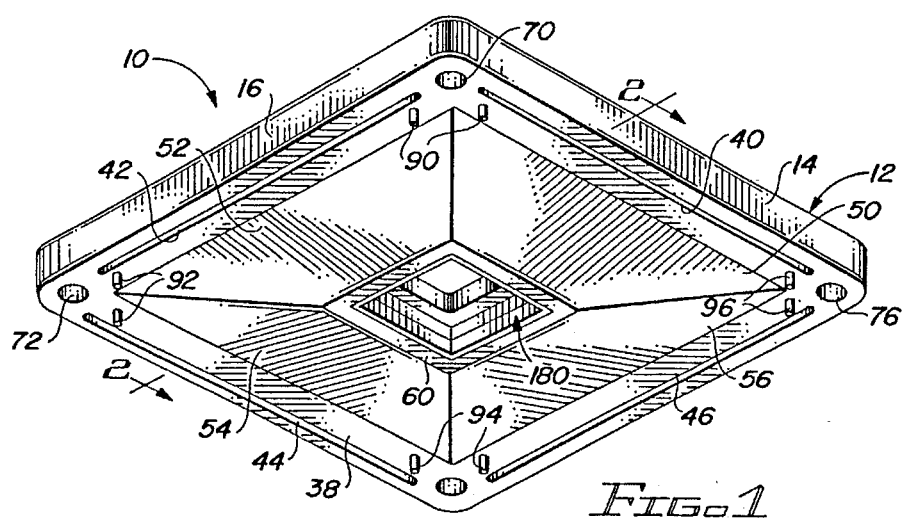
FIG. 1 is a perspective view of a portion of the apparatus of the present invention.
Figure 2:
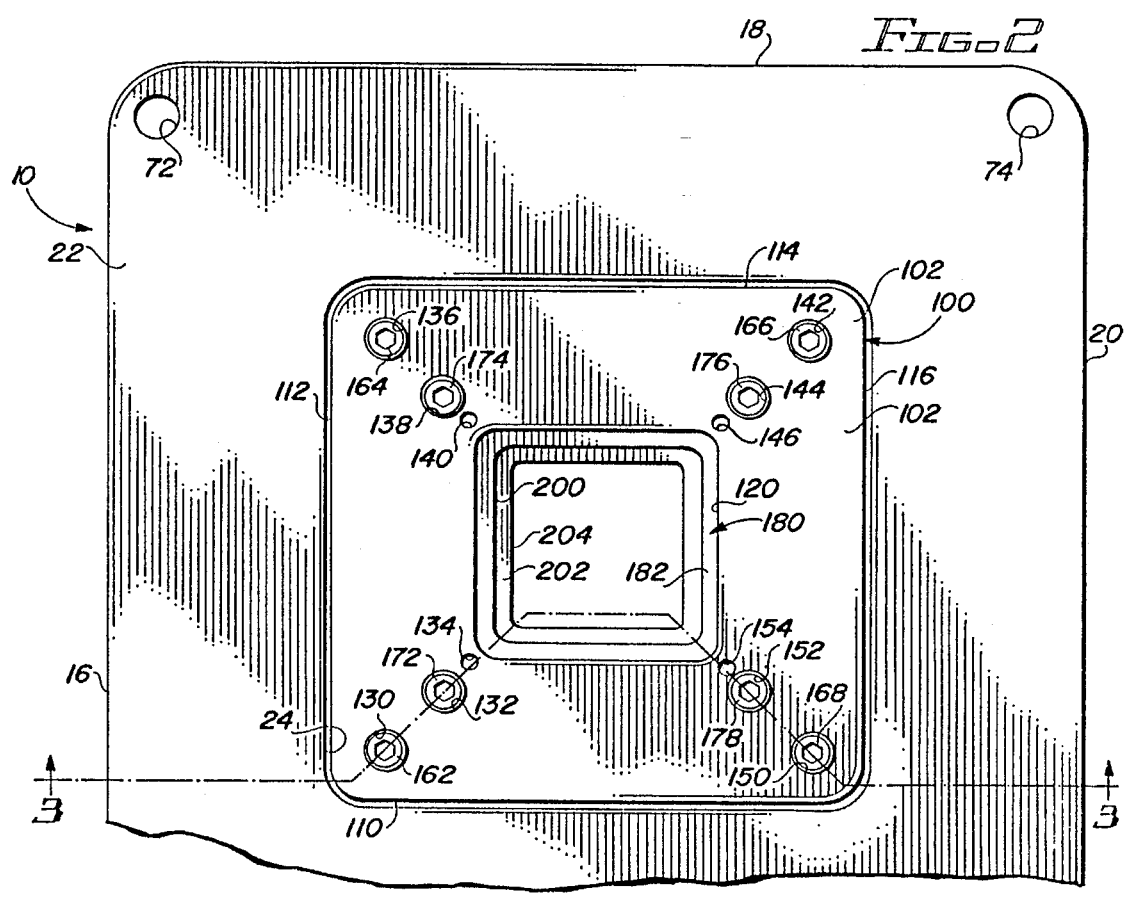
FIG. 2 is a top plan view of a portion of the apparatus of the present invention.

FIG. 1 is a bottom perspective view of a portion of the apparatus of the present invention, comprising a membrane support assembly or probe card apparatus 10. FIG. 2 is a top view of a portion of the membrane support assembly 10. FIG. 3 is view in partial section of the membrane support assembly 10 taken generally along line 3—3 of FIG. 2. The membrane support assembly 10 includes a base element 12 and an insert 180. Both elements are illustrated in FIGS. 1, 2, and 3.

FIG. 4 is an enlarged view in partial section of portions of the base element 12 and the insert 180 taken generally from Circle 4 of FIG. 3. For the following discussion of the membrane support assembly 10, reference will primarily be made to FIGS. 1, 2, 3, and 4.

The base element 12 of the membrane support assembly 10 includes four sides, including a side 14, a side 16, a side 18, and a side 20. The four sides define a generally square base element. The base element 12 also includes a planar top 22. The sides 14 . . . 20 are generally perpendicular to the planar top 22. The sides are conveniently rounded at the juncture of adjacent sides, which comprise the corners of the base element 12.

Extending downwardly through the base element 12 from the top 22 is a series of stepped cutouts. The top cutout is a cutout 24. The cutout 24 is illustrated as square, but its configuration, and the configuration of all of the cutouts, will conform to the configuration of the chips being tested. Thus, the cutout 24 will be square for testing a square chip, rectangular for testing a rectangular chip, etc.

The cutout 24 extends downwardly to a generally horizontally extending and inwardly directed shoulder 26. Extending downwardly from the inner portion of the shoulder 26 is an intermediate cutout 28. The cutout 28 extends vertically downwardly to a shoulder 30. The shoulder 30 extends inwardly from the cutout 28 to a lower cutout 32. At the bottom portion of the cutout 32 is an inwardly directed shoulder 34.

From the interior of the shoulder 34 there is an inner or bottom cutout 36. The cutout 36 extends downwardly to a bottom inner flat surface 60 which extends outwardly from the cutout 36. Extending inwardly from the four sides 14, 16, 18, and 20 is a bottom outer flat surface 38. Extending upwardly into the bottom outer flat surface 38 are four slots. The four slots are adjacent and generally parallel to the respective four sides. The slots include a slot 40 which is generally parallel to the side 14, a slot 42 which is generally parallel to side 16, a slot 44 which is generally parallel to the side 18, and a slot 46 which is generally parallel to the side 20. The slots receive resilient pressure contacts elements. A resilient element 43 is shown in FIG. 3 in slot 42.

Extending inwardly and downwardly from the bottom outer flat surface 38 are four tapered surfaces. Each of the tapered surfaces is in the general configuration of a trapezoid, with the non-parallel sides having equal lengths. The tapered surfaces include a tapered surface 50, a tapered surface 52, a tapered surface 54, and a tapered surface 56. The tapered surfaces extend inwardly from the outer flat surface 38 to the inner flat surface 60. The inner flat surface 60 is disposed between the tapered surfaces and the bottom cut out 36.

The inner or bottom flat surface 60 is generally parallel to the top planar surface 22, and to the outer planar surface 38.

There are four apertures at the four corners of the base element 12 adjacent to the outer sides. The four apertures include an aperture 70 adjacent to the juncture of the sides 14 and 16, an aperture 72 adjacent to the juncture of the sides 16 and 18, an aperture 74 adjacent to the juncture or corner of the sides 18 and 20, and an aperture 76 adjacent to the juncture or corner of the sides 20 and 14.

The apertures 70, 72, 74, and 76 receive fastening elements, such as screws, to secure the base element 12 and a probe card or membrane card to a printed circuit board in the use environment. In FIG. 3, a portion of a printed circuit board 2 is shown secured to the base element 12 and a probe card 300 by a screw assembly 4. The screw assembly 4 includes a ring or washer or the like, a screw which extends through the aperture 72, and a nut.

Extending downwardly from the shoulder 26 are four tapped apertures. Two of the tapped apertures are shown in FIG. 3. The two tapped apertures shown in FIG. 3 include an aperture 82 and an aperture 86. The tapered apertures will be discussed in more detail below.

Extending downwardly from the bottom outer flat surface 38 are four pairs of pins. The four pairs of pins include a pair of pins 90, a pair of pins 92, a pair of pins 94, and a pair of pins 96. The pairs of pins 90 . . . 96 are used to help index the membrane or probe card 300 to the base 12 and to help index or align the card 300 to the printed circuit board 2 in order to insure correct electrical contact and alignment between electrical contact elements on both the circuit board 2 and the card 300. Obviously, the board 2 will have apertures (not shown) to receive the pin pairs from the element 10. This will be discussed in more detail below.

A top plate 100 is disposed in the cutout 24 and rests on the shoulder 26. The top plate 100 has a configuration to appropriately match that of the cutout 24. The overall height or thickness of the plate 100 is about the same as the overall depth of the cutout 24. This is best illustrated in FIG. 3.

The top plate 100 includes a top surface 102 and a bottom surface 104. The bottom surface 104 is disposed on the shoulder 26. The top plate 100 includes four sides 110, 112, 114, and 116. The four sides are spaced inwardly a relatively slight amount from the sides of the cutout 24 in which the plate 100 is disposed.

As best shown in FIG. 2, the four corners of the plate 100, or the junctures of adjacent sides, are gently rounded, as are the corners of the cutout 24. Spaced inwardly from the rounded corners of the plate 100 are four apertures. The apertures receive cap screws which secure the plate 100 within the cutout 24 to the base element 12. An aperture 130 is shown in FIG. 3 aligned with the tapped aperture 82 in the base element 12. A cap screw 162 is shown extending through the aperture 130 and into the tapped aperture 82. A second aperture 150 is shown in FIG. 3 aligned with the tapped aperture 86 in the base element 12. A cap screw 168 is shown extending through the aperture 150 and into the tapped aperture 86. In addition to the cap screws 162 and 168, shown in both FIGS. 2 and 3, two other cap screws, a cap screw 164 and a cap screw 166, are shown in FIG. 2, extending through apertures 136 and 142, respectively.

There are other apertures extending through the plate 100 for other purposes. There are generally three apertures aligned from each of the corners inwardly, as best shown in FIG. 2. The apertures include an aperture 132 and an aperture 134 which extend inwardly and are aligned with the aperture 130 from the corner which comprises the juncture of the sides 110 and 112.

A pair of apertures 138 and 140 extend inwardly from the aperture 136 in which the cap screw 164 is illustrated, and which three apertures are aligned inwardly from the corner which defines a juncture of the sides 112 and 114.

Three apertures extend inwardly from the corner which defines the juncture of sides 114 and 116. They include an aperture 142 through which the cap screw 166 extends, and they also include an aperture 144 and an aperture 146. Similarly, three apertures extend inwardly from the corner which defines the juncture of the sides 116 and 110. They include the aperture 150 (see FIG. 3) and an aperture 152 and an aperture 154.

The apertures 132, 138, 144, and 152 are tapped. The four tapped apertures receive set screws which include spring loaded balls on the bottom of the set screws. Two of the set screws are shown in FIG. 3. The tops of the four set screws are also shown in FIG. 2. They include a set screw 172 in the aperture 132, a set screw 174 in the aperture 138, a set screw 176 in the aperture 144, and a set screw 178 in the aperture 152.

The set screws 172 . . . 178 are adjustable in their respective tapped apertures, as will be discussed in detail below.

The inner apertures 134, 140, 146, 154 provide communication through the plate 100 to elements on the insert 180, as will be discussed in detail below.

Disposed beneath the plate 100 and within the cutout 128 in the base element 12 is the dielectric insert 180. The dielectric insert 180 is generally of a square configuration, but having a stepped outer configuration. The stepped configuration includes both internal and external, or inside and outside, steps. The overall configuration of the insert 180 will, of course, conform to that of the cutouts 28 and 36, which in turn conform to the configuration of the cutout 24. Details of the dielectric insert or block 180 are shown in both FIGS. 3 and 4.

The dielectric insert 180 includes a top surface 182 and four upper sides defined by an outer periphery 184. Extending inwardly from the lower portion of the outer periphery 184 is an upper bottom shoulder 186. The bottom shoulder 186 is disposed above the bottom or shoulder 30 on the base element 12.

Extending downwardly from the bottom shoulder or surface 186 is another downwardly extending portion defined by an outer periphery 188. Extending inwardly from the bottom of the downwardly extending peripheral surface 188 is an inwardly extending shoulder 190. The inwardly extending shoulder 190 is a bottom shoulder. It is disposed above shoulder 34 of the base element 12.

Extending downwardly from the inner termination of the shoulder 190 is a downwardly extending portion 192.

From the bottom of the downwardly extending portion 192 is a tapering or tapered portion 194. The tapered portion 194 terminates in a bottom fulcrum 196.

The interior of the dielectric insert 180 includes an upper cut out 200. The cutout 200 is generally parallel to the outer peripheral surface 184 of the insert 180. Extending inwardly from the bottom of the cutout 200 is an inner peripheral shoulder 202. Extending downwardly from the inner peripheral shoulder 202 is a lower cut out 204.

As may be seen from FIGS. 1, 2, and 3, the upper cutout 200 and the lower cut out 204 provide visual communication through the center of the apparatus 10 to allow visual alignment of the apparatus 10 with the integrated circuit elements that are to be tested on a wafer or chip disposed beneath of apparatus 10.

There are four inner tapped apertures which extend through the upper portion of the insert 180. The apertures are disposed inwardly from the four corners, or adjacent to the four corners of the outer periphery 184. The tapped apertures extend between the top surface 182 and the upper bottom shoulder 186. Set screws are disposed in the tapped apertures. Two of the set screws are shown in FIG. 3. The two set screws shown in FIG. 3 include a set screw 210 and a set screw 216.

The four inner set screws, including the set screws 210 and 216, are adjusted through the inner apertures 134, 140, 146 and 154 in the top plate 100. The adjustment of the four inner set screws, including the set screws 210 and 216, determines the initial location of the fulcrum 196 (see FIG. 4) beneath the bottom surface 60 of the base element 12.

The location or vertical placement of the set screws 172 . . . 178 determines the upper limit, or the allowable movement, of the insert 180. Since the set screws 172 . . . 178 include spring loaded balls on or at their bottoms, and the spring loaded balls bear against the top surface 182 of the insert 180, it is obvious that upward pressure or force on the dielectric insert 180 may move the insert 180 upwardly until the spring loaded balls bottom out against the fixed portions of their respective set screws.

By use of the spring loaded set screws 172 . . . 178 which are secured in the top plate 100 and the use of the inner set screws in the insert 180, it is obvious that the insert 180 may be adjusted in any manner desired. It may be canted at any certain orientation, it may be level with respect to the appropriate surfaces of the base element 12, or it may be tilted in any particular direction, etc. Moreover, the adjustment of the set screws 172 . . . 178 with the spring loaded balls allows movement of the insert 180 up to a predetermined amount without damage to any of the elements involved. This will be discussed in detail below in conjunction with the membrane card or probe card 300 best illustrated in FIGS. 5 and 6 and as shown in its use environment in FIG. 4.

Referring again to FIG. 3, it will be noted that the apparatus 10, with the insert 180 and the card 300, may also be adjusted relative to the board 2 by varying the force or pressure against the resilient inserts in the slots 40 . . . 46, such as against the insert 43 in the slot 42 and against the insert, not shown, in the slot 44 by means of the screw assembly 4. The force or pressure against the other inserts in the other slots adjacent to the corners is adjusted by similar screw assemblies. The initial planarity of the base element 10 and the card 300, with respect to the board 2, is adjusted by the screw assemblies at the four corner apertures 70 . . . 76 of the base 12 and the mating and aligned apertures in the card 300 and the board 2. As indicated above, the insert 180 may also be separately or independently adjusted relative to the base element 12 by the various set screws discussed.

FIG. 5 is a top view of a portion of the membrane test card or probe card 300 usable with the base element 12 and the insert 180 as discussed above. FIG. 6 is an enlarged view of a portion of the card 300 taken generally from Oval 6 of FIG. 5. For the following discussion, reference will primarily be made to FIGS. 5 and 6. Additional reference will also be made to FIG. 4 and to other figures as required.

The membrane or probe card 300 includes a flexible dielectric substrate or membrane 302 containing a plurality of metallic conductive traces 308. The traces 308 may be fabricated either through photolithography processes, well known and understood in the art, or they may be plated up to a desired thickness by plating or deposition techniques also well known and understood in the art.

The membrane card 300 is generally square in configuration, conforming to the general configuration of the base 12. For aligning the card 300 to the base 12, there are a number of apertures. An aperture 304 is shown adjacent to a corner of the card. The aperture 304 will be aligned with one of the four corner apertures 70 . . . 76 of the base 12. Spaced inwardly from the aperture 304 is a pair of index apertures 306. The index apertures 306 receive a pair of indexing pins, such as one of the pin pairs 90 . . . 96, shown in FIG. 1.

The metallic traces 308 terminate inwardly in a plurality of needles 310. It is the needles 310 that actually make contact with the electrical elements on the integrated circuits on a wafer for test purposes. The needles 310 extend inwardly from a center aperture or cutout 314 of the substrate 302. The needles 310 are simply continuations of the traces 308, and are accordingly integral with the traces. No separate needle elements are required.

Outwardly the traces 308 make electrical contact with corresponding traces 3 on the printed circuit board 2 when the apparatus 10 is secured to the circuit board 2, as discussed above. This is illustrated in FIG. 3.

The center aperture or cutout 314 is a squarely configured cutout which is generally aligned with the inner or bottom cutout 36 of the base element 12 and the bottom cutout 204 of the insert 180. The center cutout 314 allows for the visual alignment of the needles 310 with the integrated circuit elements being tested.

The needles or contact elements 310, extending inwardly from the cutout 314, are bent downwardly at an acute angle from the plane of the substrate 302 of typically about 10 degrees, but the angle may vary, as indicated above. As best shown in FIG. 4, the fulcrum 196 of the dielectric block insert 180 makes contact with the needles. The fulcrum 196 of the insert 180 provides a positive downward bias for the needles 310.

The card 300 is preferably adhesively secured to the base 12. Of particular concern is the securing of the portion of the card disposed out or against the surface 60 of the base 12. If the substrate or membrane 302 separates from the surface 60, the orientation or angular orientation of the needles 310 against the chip being tested may be affected. It is desirable that the angle of the needles on the chip being tested and the force on the needles and on the chip be and remain as intended. If the card 300 separates from the base 12 in the area of the surface 60, both the angle and the force may change or vary from the intended.

In FIG. 4 and in FIG. 6 there are shown bumps or tips 312 at the outer extremities of the needles 310. The tips 312 are plated up portions at the outer end of the needles for making contact with the circuit elements on a wafer being tested. The plated up tips may or may not be used, as desired.

Referring primarily to FIGS. 3 and 4, it will be understood, as discussed above, that the location of the dielectric block 180 in relation to the base 12 and to the tips 312 will be important in making contact with the circuit elements of a wafer being tested. The vertical location of the insert 180 may vary the angular orientation with needles 310 with respect to the bottom 60 of the base element 12.

Referring again to FIG. 3, a chuck 6 is shown with a wafer 8 disposed on the top of the chuck. The wafer 8 contains a plurality of integrated circuits to be tested.

The chuck 6 is secured to an X-Y table that indexes the wafer 8, and the circuits on the wafer 8, below the needles 310 of the apparatus 10 for testing. The chuck moves vertically upwardly to provide contact between the needles 310 and the circuit elements on the wafer's integrated circuits. After testing, the chuck 6 moves downwardly, indexes to a new location to locate a new integrated circuit beneath the needles 310, and then moves upwardly to again make the connections or contacts between the needles and the circuit elements for testing.

As a wafer moves upwardly beneath the apparatus 10, the needles 310, or the outer ends of the needles, such as tips 312, make contact with the integrated circuit elements on the wafer. The angular orientation of the needles 196 causes a scrubbing action at the outer end of the needle as the wafer moves upwardly to contact the needles 310. The scrubbing action insures good contact by wiping away any impurities or oxidation or the like that may occur on both the needles 310 and the circuit elements of the wafer being tested.

Accordingly, good electrical connection is virtually assured between the needles 310 of the membrane card 300 and the circuit elements of the integrated circuits on a wafer being tested by the scrub or wiping action.

It will also be noted that, with the open center areas of the membrane card 300, the insert 180, the plate 100 and the base element 12, the needles 310, which extend into the center open area, may be visually aligned with the circuit elements being tested. The visual alignment helps to insure good electrical contact, or proper electrical contact, for expediting the testing of the integrated circuit elements on the wafer indexed beneath the apparatus 10.

It will also be noted that, with the base element 12 being made of metal, the base element may serve as a ground plane, thus obviating a separate electrical ground plane element on the membrane card 300. Moreover, the element 12 may be used as a power distribution element, etc.

If desired, it is also obvious that a membrane card may have multiple layers to provide additional contacts, if such are desired. However, only a single layered membrane card 300 is illustrated.

Returning again to FIG. 4, it will be noted that with an insert 180 having a different inwardly tapered surface 194 and a different location of the fulcrum 196, the extent of the scrub of the needle 310 may be changed or varied. Thus, as discussed above, the location of the fulcrum 196 and the vertical plane, with respect to the needles 310 and the bottom 60 of the base element 12, may be varied. Moreover, the use of a different insert, or of an insert block having a different fulcrum point 196, will also vary the angular orientation of the needle 310 and accordingly will alter the scrub of the needle 310 on the electrical elements being tested.

Returning again to FIGS. 1, 2, and 3, it will be noted that the base element 12 is easily separated into its component parts for repair, replacement, or the like. Moreover, it will be understood that the membrane card 300 is easily secured to and removed from the base 12 and that the indexing of the membrane card 300 to the base 12 is easily and accurately accomplished.

While the card 300 is preferably adhesively secured to the base 12, the two are still relatively easily separated for repair, replacement, etc. The card 300 and the base 12 are not secured together in a "permanent" relationship. Rather, the card 300 is releasably secured to the base 12 for ease of replacement, etc., as discussed above.

As has been referred to in detail above, the central open areas of the base 12, the plate 100, the insert 180, and the membrane card 300 allow for the visual alignment of the various needles 310 of the card 300 to the electrical elements on a chip being tested. Moreover, with the accessibility of the various cap screws and set screws, and the like, it will be understood that various adjustments of the insert 180, and accordingly of the needles 310 of the membrane card 300, may be easily accomplished.

FIG. 7 is an enlarged view of an alternate embodiment of a portion of the apparatus of the present invention, namely an alternate embodiment apparatus 400 which utilizes a slightly different configuration of an insert 480 within a base element 412. The insert 480, is preferably a dielectric block insert. It includes a fulcrum 490 and a groove 492 extending through the fulcrum 490. A resilient element 494 is disposed within the groove 492.

A probe card or membrane card 500 is shown disposed beneath the insert 480. The probe card 500 includes a plurality of inwardly extending needle elements 510. The resilient element 494 is shown disposed against a needle 510. The resilient element 494 applies a positive but resilient bias on the needle 510 to bias the needle 510 against a wafer being tested.

In comparing the needle 510 of FIG. 7 with the needle 310 of FIG. 4, it will be noted that the needle 510 is substantially shorter. Accordingly, a substantially greater force than that used with the apparatus 10 may be applied through the resilient element 494 against the needle 510 to insure a positive contact with circuit elements being tested on a wafer.

The needle 510, which is, of course, a continuation of the metallic trace on the probe card 500, includes a tip 512, and the tip 512 is disposed relatively close to the resilient element 494 in the groove 492 of the fulcrum 490. Since the substantially greater force may be applied to the needle 510 than may be applied to the needle 310, the tip 512 is appropriately positioned much closer to the area in which the pressure from the dielectric insert 480 is applied.

The application of greater pressure in the apparatus 400 will be accompanied by a relatively lesser amount of scrub, or longitudinal movement of the tip 512, on the circuit being tested. However, at the same time, a greater downward force on the needle 510 will provide sufficient force to insure good electrical contact through whatever impurities, oxidation, or the like, may be encountered between the tip 512 and the electronic element on the chip or wafer being tested.

In both the apparatus 10 and the apparatus 400, the insert blocks 180 and 480 have been referred to as dielectric blocks. It will be understood that the blocks need not be made of dielectric material, so long as the fulcrum or portion of the insert which contacts the needles is nonconductive to prevent the needles from being short circuited.

FIG. 8 is an enlarged view in partial section of a portion of the apparatus of the present invention, such as illustrated in FIG. 3, showing the apparatus 10 in its use environment. As indicated previously, primarily in conjunction with FIG. 3, the apparatus 10 is disposed on and secured to a printed circuit board 2. The printed circuit board 2 includes a plurality of electrical circuit elements 3 which make contact with the metallic traces or conductive traces 308 on the membrane card 300. In turn, the metallic traces 308 terminate in needles 310 which extend over the open areas of the base element 3, the top plate 100, and the insert 180.

Disposed beneath the apparatus 10 and the printed circuit board 2 is a movable chuck 6 on which is disposed a wafer 8. The wafer 8, as discussed above, includes a plurality of integrated circuit elements thereon, each of which includes a plurality of circuit elements. The tip 312 of the needle 310, makes contact with the circuit elements on the wafer 8. It is the circuit elements on the wafer 8 that are to be tested by the apparatus 10 and the printed circuit board 2.

The chuck 6 is secured to an X-Y table which moves both vertically, or in the Z plane, as well as indexing in the X-Y directions. Accordingly, as the circuit elements on a particular integrated circuit portion on the wafer 8 are appropriately tested, the chuck 6 is moved to index another integrated circuit portion, with its elements to be tested, beneath the apparatus 10 and beneath the needles 310.

As indicated above, the apparatus 10 is secured to the printed circuit board 2 by the four screw assemblies 4 at the corners of the base element 12. Once the base element 12 is free from the integrated circuit board 2, a probe card 300 may be easily removed from the base element 12 and replaced with another probe card, or the probe card may be easily repaired and then returned to the base element 12. The base element 12, with the card 300, may then be again secured to the printed circuit board 2.

The adjustment of the insert 180 with respect to the needles 310 of the probe card may be appropriately accomplished for the particular demands of the electrical elements being tested on the wafer 8. This is accomplished, as discussed above, by the adjustment of the screws 210 . . . 216 and the adjustment of the screws 172 . . . 178. Moreover, the initial planarity of the apparatus 10 may be adjusted by the screw assemblies 4 by varying the pressure of the resilient gasket elements, such as the element 43 shown in the slot 42. Other adjustments in the planarity, or otherwise, may also be made through the screws 172 . . . 178 and the screws 210 . . . 216, as desired or as required.

Figure 9:
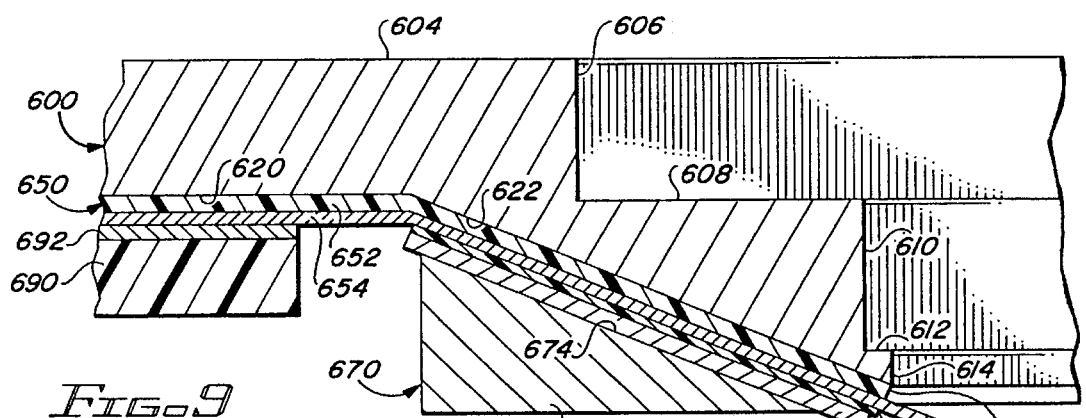
FIG. 9 is an enlarged view in partial section of a portion of another embodiment of the apparatus of the present invention.

FIG. 9 is an enlarged view in partial section of an alternate embodiment 600 of the apparatus of the present invention. The apparatus 600 differs primarily from the embodiments of FIGS. 1–8 in that there is no insert in the central cutout portions of the apparatus. Rather, forces applied on a membrane card through a sloping portion of a base element, and the membrane card is held in place by a clamp. As in the other embodiments of the membrane card, the needles or tips comprise continuations of the conductive traces, and are accordingly integral therewith, on a dielectric substrate.

The alternate embodiment apparatus 600 includes a base element 602, a membrane card 650 secured to the base element 602, and a printed circuit board 690 which in turn is appropriately secured to the base element 602 and the membrane card 650. The base element 602 includes a top surface 604 and three cutout portions mixed into the base element 602 from the top surface 604. There is a top cutout portion 606, a middle cutout portion 610, and a lower or bottom cutout portion 614. A shoulder 608 extends between the cutout 606 and the cutout 610. A shoulder 612 extends between the cutout 610 and the cutout 614. The shoulder 608 and 612 are an generally parallel to top surface 604. The cutout portion 606, 610, and 614 are generally perpendicular to the shoulders and to the top surface. The cutouts 606, 610, and 614 are generally "coaxial" with respect to each other and they are disposed generally centrally within the base element 602.

At the outer periphery of the base element 602 there is a bottom flat surface 620. The surface 620 is generally parallel to the top surface 604. Extending inwardly and downwardly from the outer bottom flat surface 620 is a tapering or sloping surface 622. The surface 622 extends between the surface 620 and the bottom cutout 614.

The membrane card 650 is appropriately disposed against and secured to the surfaces 620 and 622. The membrane card 650 includes a dielectric substrate 652, which is disposed against the surfaces 620 and 622, and a plurality of conductive traces 654 are appropriately bonded to the substrate 652. Only one such trace is, of course, shown in FIG. 9.

The dielectric substrate 652 includes a cutout 653 generally adjacent to the juncture of the sloping surface 622 and the cutout 614. The cutout 653 is aligned with the cutout portions of the base element 602 for the visual alignment of the needles which extend from the traces 654 and the integrated circuit under test. This is substantially the same as discussed above for the other embodiments of the present invention.

Each conductive trace 654 continues on downwardly and outwardly from the cutout 653 of the substrate 654 in a needle 656. That is, as in the above discussed membrane cards, the needle 656 comprises an integral continuation of the conductive trace 654. The difference between needle 656 and the conductive trace 654 is essentially the "termination" or "end" 653 of the dielectric substrate 652. The needle 656 terminates in a tip 658. If desired, the tip 658 may include a plated on thickened tip portion, such as shown in FIGS. 4, 7, and 8, to help insure good electrical contact between the needle 656 and a circuit element under test. However, such a thickened tip or bottom bump may not be necessary.

A clamping block 670 is shown disposed against the membrane card 650 along the sloping surface 622. The clamp 670 includes a block 672, and there is a sloping surface 674 on the block 672. The sloping surface 674 generally matches the sloping surface 622 of the base element 602.

A pressure plate 676 and an insulator 678 are disposed between the sloping surface 674 of the block 672 and the probe card 650. The insulator 678 is disposed against the conductive traces 654, and the pressure 676 is disposed between the insulator layer 678 and the sloping surface 674. The pressure plate 676 allows pressure to be uniformly be placed on the membrane card 650 along the sloping surface 622, and the insulator 678 provides the necessary dielectric layer and protective layer for the conductive trace(s) 654. The clamp 670 is appropriately secured to the base element 602.

A portion of the printed circuit board 690 is shown disposed against the membrane card 650 and against the base element 602. The printed circuit board includes electrical circuit 692 on the top or upper surface of the board 690. The electrical circuitry 692 is shown in electrical contact with the trace 654 of the membrane card 650. This is substantially the same as disclosed above, in FIGS. 3 and 8.

In the embodiments of FIGS. 1–8, discussed in detail above, there is an insert in the cutout portions of the base elements, and it is the insert that applies downward force on the needles of the probe cards to bias the needles against an integrated circuit under tab. In the embodiment of FIG. 9, the need for the insert is obviated and the base element itself provides a downward force to bias the needles against a circuit under tab. The clamp holds the probe or membrane card against the base element and the base element is then appropriately lowered against a circuit under test, as discussed above, and it is the base element 602, primarily through its sloping side 622, that causes the needle(s) 656 to contact an integrated circuit under test.

It will be noted that in FIGS. 5 and 6 a single probe card is shown with four quadrants of metallic traces and needle elements. It will be understood that a probe card may be fabricated of four separate quadrants of metallic traces and needles, if desired. The latter design may be especially applicable or desirable for the embodiment of FIG. 9. In the embodiment of FIG. 9, four separate clamp elements may be used, with a separate clamp element for each membrane quadrant.

While only single metal layer membrane cards are shown in the drawing and discussed in the specification above, it will be understood that multilayer membrane cards, having a metal layer ground plane for impedance control, may be used. Such is shown in conjunction with the various embodiments of die or chip carriers or holders discussed below. The carriers or holders discussed below in several different embodiments are used in conjunction with integrated circuit dies or chips. The above discussed probe cards have been explained in conjunction with the testing of integrated circuit wafers before the wafers have been cut into a plurality of discrete dies or chips. In the following discussion, probe cards are used in conjunction with the dies or chips after they have been cut from wafers.

Generally, in the following discussion emphasis will be place on the carrier or holder apparatus for the dies or chips, and probe cards will be discussed only in broad terms. However, specific details of probe cards will be discussed in conjunction with some embodiments.

Figure 10:
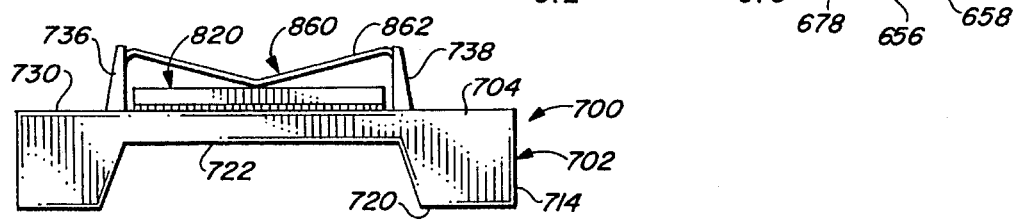
FIG. 10 is an end view of the die holder apparatus of the present invention.
Figure 11:
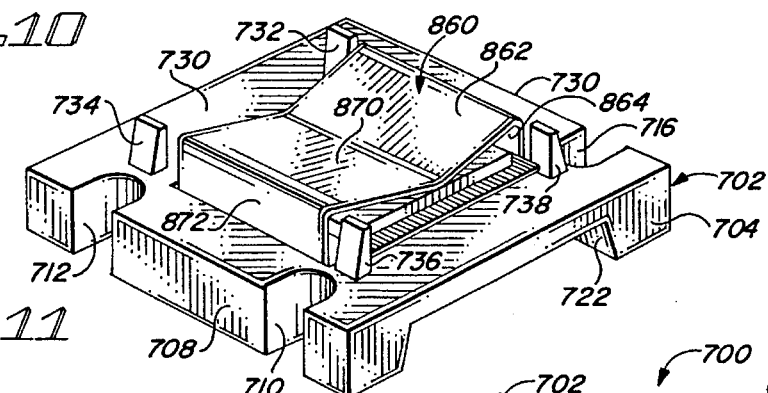
FIG. 11 is a perspective view of the apparatus of FIG. 10.
Figure 12:
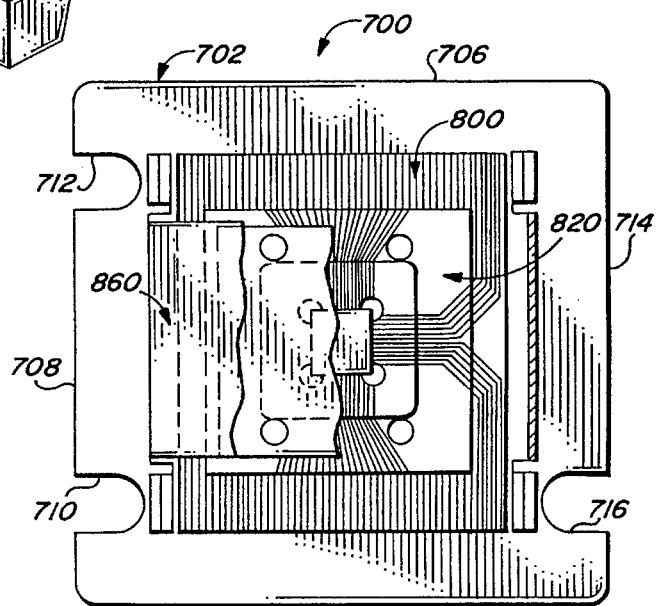
FIG. 12 is a top view, partially broken away, of the apparatus of FIGS. 10 and 11.

FIG. 10 is an end view of die or chip carrier apparatus 700. FIG. 11 is a perspective view of the apparatus 700, and FIG. 12 is a top view of the apparatus 700. FIG. 13 is an exploded perspective view of the apparatus 700. For the following discussion of the die or chip carrier or holder apparatus 700, reference will be made to FIG. 10, 11, 12, and 13.

The carrier apparatus 700 includes a carrier block 702, and the carrier block 702 defines a base element. The block 700 includes a pair of ends 704 and 706 which are generally parallel to each other, and a pair of sides 708 and 714, which are also parallel to each other and which are generally perpendicular to the ends 704 and 706.

The side 708 includes a pair of recesses 710 and 712, and the side 714 includes a recess 716. The three recesses 710, 712, and 716 are used for purposes for mounting and aligning. The two recesses on one side, and the recess on the other side insure that the carrier apparatus 700 can be located in only one orientation for test purposes.

The block 702 also includes a bottom surface 720 and a top surface 730. The bottom and top surfaces are generally parallel to each other. Extending through the bottom surface of the block 702 is an axial recess or slot 722. Extending upwardly from the top surface 730 are four guard bosses or pylons 732, 734, 736, and 738.

Extending downwardly from the top surface 730, and generally centered with respect to the sided and ends, is a square bore 740. Extending into the bore 740, slightly below the top surface 730, are two alignment plate shelves 750 and 754. The alignment plate shelves 750 and 754 have a pair of apertures extending through the shelf. The shelf 750 includes two apertures 752, and the shelf 754 includes two apertures 756.

An alignment plate 770 is disposed on the alignment plate shelves 750 and 754. The alignment plate 770 includes a square inner die receiving bore 772. The bore 772 is configured to receive an integrated circuit die or chip 880, as will be explained below. Above the inner die receiving bore 772 is a larger outer bore 774. A shelf area 776 is defined between the two bores.

The alignment plate 770 includes four apertures which are appropriately aligned with the apertures in the shelves 750 and 754. The apertures in the chip alignment plate 770 are outwardly from the outer bore 740. They include a pair of apertures 780 and a pair of apertures 782. The apertures 780 are aligned with the apertures 756, and the apertures 782 are aligned with the apertures 752.

Disposed on the chip alignment plate 770, and extending outwardly onto the top surface 730, is a probe card 800. The probe card 800 is substantially the same as the probe cards discussed above. The probe card 780 includes a dielectric substrate on which there are a plurality of probe traces 802. There is an open area or aperture extending through the dielectric substrate, and a plurality of probe needles 804 extend into the open area. The probe needles 804 are continuations of the probe traces 802. That is, the probe needles 804 are extensions of, and are accordingly integral with, the probe traces 802. The outer ends of the probe needles 804 are bent downwardly to make appropriate contact with conductive elements or paths or pads on the integrated circuit chip 880.

The probe card 800 also includes four apertures extending through it. There is a pair of apertures 806 and a pair of apertures 808. The apertures 806 are aligned with the apertures 780 and 756, and the apertures 808 are aligned with the apertures 782 and 752.

Disposed on top of the probe card 800 is a contact plate 820. The contact plate 820 includes a centrally disposed square boss that extends downwardly from the bottom of the contact plate. Extending through the square boss and the contact plate is a generally square aperture 824. The presence of the square boss may be understood from FIG. 13 by noting that the depth or height of the square aperture 824 is greater than the thickness of the contact plate 820 itself. FIG. 15 comprises a view in partial section through a contact plate 990 which will be discussed in detail below in conjunction with the embodiment of FIG. 14. The contact plate 820 is substantially identical to the contact plate 990, and reference will be made in more detail to the configuration of the contact plates and their square bosses below, in conjunction with the contact plate 990.

The contact plate 820 also includes four apertures, including a pair of apertures 826, and a pair of apertures 828. The apertures 826 are aligned with the apertures 806, 780, and 756, and the apertures 828 are aligned with the apertures 808, 782, and 752.

When the four elements are appropriately aligned and assembled, they are held together by four rivets or other appropriate fastening elements 840. The rivets or fastening elements 840 extend through the various aligned apertures.

The integrated circuit or die 880 is shown disposed beneath the block 702 and above a rectangular die or chip support plate 890. The die or chip support plate 890 includes a central vacuum aperture 892 and a pair of spring slots 894 and 896. The die or chip 880 is placed on the carrier plate 890 and is held in location by a vacuum force applied through the vacuum aperture 892 from an appropriate vacuum source, well known and understood in the art. The chip 880 is then moved into position within the die receiving bore 772 of the alignment plate 770. When the die or chip 880 has been appropriately located in the aperture 772, the chip support plate 890, with its die or chip 880 secured thereto by the vacuum force, is held in place against the block 702, and the other elements as secured together by the fastening elements 840, by a spring 860. The spring 860 includes a pair of arms 862 and 870. Extending downwardly from the arms 862 and 870 are legs 864 and 872, respectively. Extending downwardly from the legs 864 and 872 are extensions 866 and 874, respectively. The extensions terminate in a pair of feet, including a foot 868 on the extension 866, and a foot 876 on the extension 874. The legs 864 and 872 extend downwardly through the square bore 740 and through the spring slots 894 and 896, respectively, with the feet 868 and 876 applying an upward bias on the plate 890 to hold the plate, with its die or chip 880, securely in place relative to the block 702 and to the alignment plate 770.

The testing of the circuitry on the die or chip 880 is then accomplished by appropriate electronic signals impressed upon the traces 802 of the probe card 800.

FIG. 14 is an exploded perspective view of die carrier apparatus 900, which comprises an alternate embodiment of the die carrier apparatus 700 of FIGS. 10–14. FIG. 15 is a view in partial section taken generally along line 15—15 of FIG. 14. For the following discussion of the die carrier apparatus 900, reference will be made to both FIGS. 14 and 15.

The primary difference between the die carrier apparatus 900 of FIGS. 14 and 15 and die carrier apparatus 700 of FIGS. 10–13 is that the die or chip alignment plate 770 of the carrier apparatus 700 has been made integral with a block of the apparatus 900. In other respects, the two carrier apparatus are generally identical.

The die carrier apparatus 900 includes a carrier block 902 which is a base element. The block 902 includes a pair of ends, of which an end 904 may be seen in FIG. 14. The carrier block 902 also includes a pair of sides, of which a side 908 is shown in FIG. 14. Two recesses 910 and 912 are shown extending into the side 908. The opposite side includes a recess 916, which is also shown in FIG. 14.

An axial slot 922 is shown extending through the block 902 upwardly from the bottom surface of the block.

The block 902 also includes a top surface 930, which is generally parallel to the bottom surface. Four guard bosses or pylons 932, 934, 936, and 938 extend upwardly from the top surface 930.

Spaced inwardly from the opposite sides of the block 902 are two spring slots. The spring slots include a slot 950 and a slot 952. The slots 950 and 952 are spaced inwardly from the sides of the block and extend through the block to communicate with the slot or recess 922.

Extending through the block from the surface 930 and extending to the recess or slot 922 are two bores, including an inner or lower center square die or chip bore 960 and an outer bore 962. The bores 960 and 962 provide substantially the same function and the bores 772 and 774, respectively.

An apron or shelf extend between the bore 960 and the bore 962. The shelf 964 is, of course, below the surface 930 of the block 902.

Spaced apart outwardly from the outer or upper bore 962, and extending through the block 902 downwardly from the top surface 930, are four apertures 970.

A probe card 980 is shown in FIG. 14 disposed above the block 902. The probe 980 is substantially identical to the probe card 800 discussed above in conjunction with the carrier apparatus 700. The probe 980 includes a dielectric substrate on which are a plurality of connective traces 982. In the center of the probe card is a cut out area or aperture, and extending into and downwardly through the aperture or cut out portion are needles 984. The needles 984 comprise extensions or continuations of the traces 982. Four apertures 986 extend through the probe card. The apertures 986 are appropriately aligned with the apertures 970 in the block 902.

Above the probe card 980 is the contact plate 990, referred to above. The contact plate 990 is shown in FIG. 15 in partial section. The contact plate 990 includes a downwardly extending central boss 992, and an aperture 994 extends through the contact plate 990 and through the boss 992. The boss 992 is dimensioned so as to fit within the opening in the probe card so that the boss 992 contacts the needles 984 and applies a downward bias on the needles 984 to urge the needles 984 against the integrated circuit or chip being tested.

Four apertures 996 extend through the contact plate 990. The apertures 996 are appropriately aligned with the apertures 986 in the probe card 980 and the apertures 970 in the block 902. A rivet or fastening element 100 is shown aligned with the apertures 970, 986, and 996. The fastener elements 1000 are used to secure the three elements, including the block 902, the probe card 980, and the contact plate 990 together.

Illustrated below the block 902 is an integrated circuit die or chip 1030. The die or chip 1030 is shown disposed above a chip support plate 1040. The chip support plate 1040 is substantially identical to the chip support plate 980 discussed above in conjunction with the apparatus 700. The chip support plate 1040 includes a center vacuum aperture 1042 and two spring slots 1044 and 1046 which are adjacent to the outer ends of the plate 1040. The die or chip 1030 is appropriately secured to the plate 1042 be vacuum pressure exerted through the aperture 1042. The plate 1040 with the die or chip 1030 is then disposed against the block 902, with the chip or die 1030 disposed in the aperture 960. The plate 1040, and accordingly the chip 1030, are then secured to the block 902 and to the other elements secured thereto, by a spring 1010. The spring 1010 is substantially identical to the spring 860. The spring 1010 includes a pair of arms 1012 and 1020, and a pair of legs 1014 and 1022 extend downwardly from the arms 1012 and 1020, respectively. The leg 1014 includes an extension 1016, and the extension 1016 terminates in a foot 1018. The leg 1022 includes an extension 1024, and the extension 1024 terminates in a foot 1026. The feet 1018 and 1026 extend outwardly from their extensions 1016 and 1024, respectively. The legs and extensions of the spring 900 extend through the slots 1050 and 1052 and through the slots 1044 and 1046 to appropriately secure the plate 1040 to the block and its assembled elements.

The boss 992 of the contact plate 990 applies a downward bias on the needles 996 to urge the needles 986 into contact with the appropriate electrical pads or conductors on the chip or die 1030. Electrical signals applied through the traces 984 then test the circuitry of the chip or die 1030.

FIG. 16 comprises an exploded perspective view of another alternate embodiment, namely die or chip carrier apparatus 1100. FIG. 19 is a view in partial section of a portion of the carrier apparatus 1100 in its assembled state. In the following discussion reference will be made to both FIGS. 16 and 19. The die or chip carrier apparatus 110 comprises a top loading carrier, in which the die or chip is loaded from the top, rather than from the bottom, as with the carrier apparatus 700 and 900, discussed above.

The carrier apparatus 1100 includes a carrier block 1102, and the carrier block 1102 comprises a base element for the apparatus. The block 1102 includes a pair of ends, of which an end 1104 is shown in FIG. 16. The block 1102 also includes a pair of sides, with a side 1114 shown in FIG. 16 and a side 1108 shown in FIG. 19. FIG. 19 is a view in partial section of a portion of the assembled carrier apparatus 1100.

A pair of recesses 1110 and 1112 extend inwardly from the side 1108. A single recess 1116 extends inwardly from the side 1114.

The block 1102 includes a bottom 1120, shown in FIG. 19, and a top 1130, shown in both FIGS. 16 and 19. An axially extending slot 1122 extends upwardly from the bottom 1120 between the two ends of the block 1102.

Extending upwardly from the top surface 1130 are four guard bosses or pylons 1132, 1134, 1136, and 1138. Extending axially downwardly from the top surface 1130, and between the aligned pylons 1132, 1134, and 1138, 1136, is a top slot 1140. The slot 1140 extends downwardly from the top surface 1132 a relatively short distance. The slot 1140 is accordingly relatively shallow. The slot 1140 is divided into two shelf portions 1142 and 1146 by a bore 1150. A pair of apertures 1144 extend through the shelf portion 1142 adjacent to the bore 1150. A pair of apertures 1148 extend through the shelf portion 1146 adjacent to the bore 1150.

A pair of recesses, or undercut areas, extend between the bore 1150 and the bottom slot 1122. One of the recesses, a recess 1152, is shown in both FIGS. 16 and 19. The recesses, of which the recess 1152 is one, are used in conjunction with a spring 1240, which will be discussed in detail below.

A probe card 1170 is shown above the block 1102. The probe card 1170 is disposed in the slot 1140, as shown in FIG. 19.

The probe card 1170 is also shown in FIG. 18. FIG. 18 comprises a view in partial section through the probe card 1170, and is taken generally along line 18—18 of FIG. 16. Reference will be made to both FIGS. 16 and 18 for the following discussion of the probe card 1170.

The probe card 1170 includes a dielectric substrate 1172. The substrate 1172 includes a thickened center portion 1174. The thickened portion 1174 is disposed about a central aperture or cut out portion 1176. A plurality of conductive traces 1178 are disposed on top of the substrate 1172, including on the thickened center portion 1174. A plurality of needles 1180 extends from the traces 1178 over the aperture or cut out portion 1176. The needles 1180 are integral with the traces 1178, and comprise continuations or extensions of the traces 1178. The needles 1170 extend generally upwardly over the aperture or cut out 1176. The purpose of the upwardly and inwardly extending 1180 is to make appropriate contact with a chip 1230 disposed on top of the probe card 1170.

Four apertures 1182 extend through the probe card 1170. The apertures 1182 are appropriately aligned with the apertures 1144 and 1184 of the block 1102.

Above the chip or die 1230 is a chip or die alignment plate 1190. The chip or die alignment plate 1190 includes a downwardly extending bottom rim 1192. The rim 1192 is disposed on the outer periphery of the generally square plate 1190. Inwardly from the rim 1192 is a center portion 1194. A chip receiving aperture 1196 extends through the center portion 1194. Four apertures 1198 extend downwardly through the rim 1192.

The block 1102, the probe card 1170, and the chip alignment plate 1190 are appropriately secured together by four fasteners or rivets 1120. The rivets 1120 extend through the apertures 1144, 1148 in the block 1102 and through the apertures 1182 and 1198 of the probe card 1170 and the alignment plate 1190, respectively. The three elements are then held together. The chip 1230 is then disposed in the aperture 1196 in the alignment plate 1190. The chip is then held in place in the alignment plate, and is biased downwardly against the needles 1180, by a contact plate 1210. The contact plate 1210 includes four apertures 1212 which are aligned with the apertures 1144, 1148 and the apertures 1182 and apertures 1198 in the three elements which are secured together. The apertures 1198 have a larger diameter than do the apertures in the block, the probe card, and the alignment plate. The purpose of the relatively large apertures 1212 may be understood best by reference to FIG. 17. FIG. 17 is a view in partial section taken generally along line 17—17 of FIG. 16, and through the alignment plate 1190 and the contact plate 1210, with the fastener element or rivet 1220 shown secured to the alignment plate 1190. The head of the rivet 1220 extends upwardly from the top of the alignment plate 1190 and is disposed in an aperture 1212 in the contact plate 1210.

The apertures 1144, 1148 in the block 1102, and the apertures 1182 in the probe card 1170 and 1198 in the plate 1190, are dimensioned so as to be substantially the same diameter as the outer diameter of the fastening elements or rivets 1220. Accordingly, when the three elements are secured together by the fastener, the elements will be held in close alignment. This same thing is true with respect to the fastener elements 1100 and 840, and their associated apertures for the carrier apparatus 900 and 700, as discussed above. The relatively tight fit of the fastener elements and the apertures is, of course, necessary in order that the various elements be secured together in a relatively precise alignment due to the dimensional constraints with respect to the dies or chips being tested. This is, of course, relatively well known and understood in the art.

The spring 1240 is used to secure the chip or die 1230 in place in the aperture 1196 by a downward bias against the contact plate 1210. The spring 1240 is substantially identical to the springs 1010 and 860, discussed above. The spring 1240 includes two arms 1242 and 1248, which are appropriately secured together. The arm 1242 includes a leg 1244 extending downwardly, and a foot 1246 extends outwardly from the bottom of the leg 1244. The arm 1248 includes a leg 1250 extending downwardly, and a foot 1252 extends outwardly from the bottom of the leg 1250.

The feet 1246 and 1252 extend outwardly into the recesses defined between the bore 1150 and the slot 1122. In FIG. 19, the foot 1252 is shown extending into the recess 1152. The recess 1152, and its opposite counterpart, may be referred to as spring recesses.

The three die or chip carrier apparatus discussed above, including the apparatus 700, the apparatus 900, and the apparatus 1100, are each auto-aligning with respect to the dies or chips being tested due to the presence of an alignment plate with a chip or die receiving aperture extending through the plate. In the apparatus 900, the alignment plate is integral with the block. The alignment plate in the apparatus 700 and the apparatus 1100 are separate elements. The use of the alignment plates, with their chip receiving apertures, assumes that the dies or chips may be fabricated or cut with very close tolerances so that the probe needles will make appropriate contact with specific locations on the chips during testing. The testing is then carried out by appropriate contact with the traces on the probe cards, as discussed above.

Alternate methods of both testing of the chips and aligning are illustrated in FIGS. 20, 21, and 22. FIG. 20 is a view in partial section of another alternate embodiment of the apparatus of the present invention illustrating alternate structure for testing an integrated circuit die. For the following discussion, reference will be made to FIG. 20.

FIG. 20 comprises a view in partial section of an alternate embodiment 1300 of the chip or die holder apparatus discussed above. The apparatus 1300 includes a chip alignment plate 1302, which is similar to the chip alignment plate 1190 discussed above in conjunction with the apparatus 1100. The chip alignment plate 1302 includes a rim 1304 on the outer periphery of the plate. Inwardly from the rim 1304 is a center section, with a chip receiving aperture 1308 extending through the center portion. An integrated circuit chip or die 1320 is shown disposed in the aperture 1308.

A chip support plate 1330 is shown disposed above the chip alignment plate 1302 and above the chip 1320.

Adjacent to the alignment plate 1304 is a printed circuit board 1340. The printed circuit board 1340 includes a substrate 1342, with a plurality of conductive traces 1344 disposed on the substrate 1342. The purpose of the printed circuit board is, of course, to provide the appropriate circuitry for testing the die or chip 1320.

A probe card 1350 is schematically illustrated beneath the chip alignment plate 1302 and extending to the PC board 1340. Conductive needle elements on the probe card 1350 make electrical contact with both the traces 1344 on the PC board 1340 and with the appropriate conductive elements on the chip or die 1320. A biasing element 1360 is disposed beneath the probe card 1350. The biasing element 1360 includes a center portion 1362 and outer and upwardly extending portions 1364 and 1366. The outer and upwardly extending portions 1364 and 1366 bias the appropriate outer portions of the probe card 1350 against the chip or die 1320 and the traces 1344 and the PC board, respectively.

The purpose of the apparatus 1300 is to eliminate a socket which is normally used to interconnect the printed circuit board and the probe card. With the probe card biased into direct contact with both the PC board and the chip, the need for an intermediate connector socket is eliminated.

FIG. 21 is a view in partial section through a portion of another alternate embodiment 1400 of the apparatus of the present invention. The apparatus 1400 comprises chip or die carrier apparatus in which a integrated circuit die or chip is visually aligned, or aligned by appropriate visual recognition, rather than automatically as discussed above in conjunction with the various carrier apparatus discussed above.

The apparatus 1400 includes a block 1402 which comprises a base for the apparatus. A probe card 1410 is disposed on the block 1402. The probe card 1410 is structurally different from the probe cards discussed above in that it includes a power or ground plane in addition to signal traces. The probe card 1410 includes a dielectric substrate 1412, with a power or ground plane conductive layer 1414 appropriately disposed on one side of the substrate 1412, and a plurality of conductive signal traces 1416 disposed on the opposite side of substrate 1412. The signal traces 1416 terminate in needles 1418, substantially as discussed above. The needles 1418 are, of course, extensions or continuations of the conductive traces 1416.

A contact plate 1420, similar to the contact plates 820 and 990, discussed above, is disposed on the probe card 1410. The block 1402, the probe card 1410, and the contact plate 1420 are appropriately secured together by a fastening element or rivet 1430. The contact plate 1420 includes a downwardly extending boss 1422 which applies the downward bias on the inner portion of the probe card 1410 to bias the needles 1418 against the die or chip 1440.

Beneath the block 1402 is a chip support plate 1450. The chip support plate 1450 includes a center vacuum hole or aperture 1452 which holds the chip 1440 in place. The chip support plate 1450 is in turn appropriately secured to a movable chuck 1470. The chuck 1470, with the chip support plate 1450 and the chip 1440, is moved relative to the block 1402, the probe 1410, and the contact plate 1420 to align the chip 1440 appropriately with respect to the needles 1418 of the probe card 1410. When the proper or appropriate alignment has been accomplished, a spring 1460 is then used to secure the chip support plate 1450 in place. The spring 1460 is substantially identical to the springs discussed above in conjunction with the carrier apparatus 700, 900, and 1100.

Another alternate embodiment of the apparatus of the present invention is illustrated in FIG. 22. FIG. 22 comprises a view in partial section of a portion of apparatus 1500 which combines some of the elements of FIGS. 20 and 21.

The apparatus 1500 includes a chip alignment plate 1502, which is substantially identical to the chip alignment plate 1302 discussed above in conjunction with the apparatus 1300 of FIG. 20. The chip alignment plate 1502 includes an outer, downwardly extending rim 1504, with a center section and an aperture 1506 extending through the center section. The aperture 1506 receives a chip or die 1510 which is to be tested.

A chip support plate 1520 is shown disposed on the top of the chip alignment plate 1502 and on or against the integrated circuit chip or die 1510. The plate 1520 holds the chip in place within the aperture 1506.

A probe card 1530 is shown beneath the alignment plate 1502. The probe card 1530 includes a dielectric substrate 1532, with conductive elements on opposite sides of the substrate 1532. A ground plane or power strip 1534 is on one side of the substrate 1532, and signal traces 1536 are disposed on the opposite side of the substrate 1532. The signal traces 1536 terminate in needles 1538. The needles 1538 make electrical contact with the appropriate elements on the chip 1510.

Spaced apart from the chip alignment plate 1502 is a tester element 1560. The tester element 3560 includes a contact 1562 which is disposed against a base 1536 of the probe card 1530. The contact 1562 is in direct electrical contact with the signal trace 1536. The tester 1560 is, of course, only schematically represented.

Beneath the probe card 1530 is a contact plate 1550. The contact plate 1550 includes a generally flat center portion 1552 on which the probe card 1530 is disposed. The contact plate 1550 also includes an upwardly extending inner rim 1552 which biases the needles 1538 of the probe card 1530 against the integrated circuit die or chip 1510.

The use of the ground plane on the probe cards 1410 and 1530 allow the use of higher frequencies in the testing of the integrated circuits. The use of the ground planes in conjunction with the probe cards of FIGS. 21 and 22 may provide a number of advantages, including the use of higher frequencies in the testing operations. As indicated above, the use of ground planes on probe cards may also be used in conjunction with the other carrier units of FIGS. 10–19 and with the probe card apparatus of FIGS. 1–9.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, within the limits only of the true spirit and scope of the invention.

What we claim is:

1. Carrier apparatus for supporting an integrated circuit die for testing the die comprising in combination:

carrier block means comprising a base for receiving and supporting an integrated circuit die to be tested;

probe card means disposed on the carrier block means for testing the integrated circuit die, including
   a substrate,
   an aperture extending through the substrate,
   a plurality of conductive traces, each comprising two portions, a first portion on the substrate and a second portion extending beyond the substrate and into the aperture and terminating in a tip for contacting the integrated circuit die for testing, the second portion comprising a probe needle extending from the first portion;

an alignment plate disposed on the carrier block means for aligning the probe card means and the integrated circuit die;

support plate means for supporting the integrated circuit die relative to the carrier block means and the probe card means; and means for securing the carrier block means, the probe card means, the alignment block and the support plate means with the integrated circuit die together for testing the integrated circuit die.

2. The apparatus of claim 1 in which the probe card means further includes a contact plate for urging the probe needles against the integrated circuit die for testing.

3. The apparatus of claim 2 in which the contact plate includes a boss for contacting the probe needles for urging the probe needles against the integrated circuit die.

4. The apparatus of claim 1 in which the carrier block means includes a base having a bore, and the integrated circuit die is disposed at the bore for testing.

5. The apparatus of claim 1 in which the carrier block means includes means for biasing the plurality of probe needles against the integrated circuit die.

6. The apparatus of claim 5 in which the biasing of the probe needles against the integrated circuit die provides a scrubbing action of the needles against the integrated circuit die to provide positive electrical contact between the probe needles and the integrated circuit die.

7. The apparatus of claim 6 in which the means for biasing the plurality of probe needles against the integrated circuit die includes a contact plate, an aperture extending through the contact plate and aligned with the integrated circuit die, and a boss extending outwardly from the contact plate and about the aperture, and the boss contacts the plurality of probe needles to bias the probe needles against the integrated circuit chip.

8. The apparatus of claim 1 in which the means for securing the carrier block means, the probe card means, and the support plate means together includes a spring extending between the carrier block means and the support plate means.

9. The apparatus of claim 1 in which the alignment plate includes an aperture for receiving the integrated circuit die, and the alignment plate is disposed against the carrier block means.

10. The apparatus of claim 1 in which the carrier block means includes a carrier block and a bore extending through the carrier block.

11. The apparatus of claim 10 in which the alignment plate is disposed in the bore of the carrier block.

12. The apparatus of claim 1 in which the carrier block means includes a block, a first bore in the block, and a second bore communicating with the first bore for receiving the integrated circuit die and for aligning the integrated circuit die relative to the probe needles of the probe card means.

13. The apparatus of claim 1 in which the probe card means further includes a ground plane secured to the substrate.

14. Apparatus for testing integrated circuit dies comprising in combination:

an integrated circuit die to be tested;

carrier means for supporting the integrated circuit die;

probe card means disposed on the carrier means for providing electronic signals for testing the integrated circuit die, including
   a substrate,
   a plurality of conductive traces, each including a first portion on the substrate and a second portion extending from and integral with the first portion and extending to a tip contacting the integrated circuit die, the second portion defining a needle;

means for aligning the integrated circuit die relative to the needles of the probe card means; and means for securing together the carrier means, the integrated circuit die, and the probe card means for testing the integrated circuit die, including
a contact plate disposed on the probe card means, and spring means for securing the contact plate and the probe card to the carrier means.

15. The apparatus of claim 14 in which the means for aligning the integrated circuit die includes an alignment plate securable to the carrier means and an aperture in the alignment plate for receiving the integrated circuit die.

16. The apparatus of claim 15 in which the carrier means includes a carrier block and a bore in the carrier block.

17. The apparatus of claim 16 in which the means for aligning the integrated circuit die relative to the needles on the probe card includes means for locating the alignment plate relative to the bore in the carrier block.

18. The apparatus of claim 14 in which the carrier means includes a carrier block and a first bore in the carrier block, and the means for aligning the integrated circuit die includes a second bore in the carrier block for receiving the integrated circuit die.

19. The apparatus of claim 14 in which the carrier means includes means for biasing the needles of the probe card means against the integrated circuit die.

20. The apparatus of claim 14 in which the probe card means further includes an aperture extending through the substrate and the needles extend into the aperture from the conductive traces on the substrate.

21. The apparatus of claim 20 in which the needles of the probe card means extend at an obtuse angle relative to the substrate and the conductive traces for providing a scrub action on the integrated circuit die as the needles contact the integrated circuit die.

22. The apparatus of claim 21 in which the carrier means further includes means for biasing the needles of the probe card means against the integrated circuit die to provide the scrub action.

23. The apparatus of claim 14 in which the probe card means further includes a ground plane secured to the substrate.

* * * * *